United States Patent
Fang et al.

(10) Patent No.: US 9,972,554 B2
(45) Date of Patent: May 15, 2018

(54) WAFER LEVEL CHIP SCALE PACKAGE HAVING CONTINUOUS THROUGH HOLE VIA CONFIGURATION AND FABRICATION METHOD THEREOF

(71) Applicant: POWERTECH TECHNOLOGY INC., Hsinchu County (TW)

(72) Inventors: Li-Chih Fang, Hsinchu County (TW); Chia-Chang Chang, Hsinchu County (TW); Hung-Hsin Hsu, Hsinchu County (TW); Wen-Hsiung Chang, Hsinchu County (TW); Kee-Wei Chung, Hsinchu County (TW); Chia-Wen Lien, Hsinchu County (TW)

(73) Assignee: POWERTECH TECHNOLOGY INC., Hsinchu County (TW)

( * ) Notice: Subject to any disclaimer, the term of this patent is extended or adjusted under 35 U.S.C. 154(b) by 0 days. days.

(21) Appl. No.: 15/432,932

(22) Filed: Feb. 15, 2017

(65) Prior Publication Data
US 2017/0256471 A1 Sep. 7, 2017

(30) Foreign Application Priority Data
Mar. 4, 2016 (TW) .............................. 105106770 A

(51) Int. Cl.
*H01L 29/40* (2006.01)
*H01L 23/52* (2006.01)
(Continued)

(52) U.S. Cl.
CPC .......... *H01L 23/3114* (2013.01); *H01L 21/56* (2013.01); *H01L 21/76898* (2013.01); *H01L 23/3121* (2013.01); *H01L 23/481* (2013.01); *H01L 23/49827* (2013.01); *H01L 23/562* (2013.01); *H01L 24/03* (2013.01); *H01L 24/06* (2013.01); *H01L 24/11* (2013.01);
(Continued)

(58) Field of Classification Search
CPC ................. H01L 23/3114; H01L 24/11; H01L 27/14636; H01L 27/14627; H01L 27/14618; H01L 24/32; H01L 21/76898; H01L 21/56; H01L 27/14632; H01L 24/03; H01L 24/83; H01L 23/3121; H01L 23/49827; H01L 23/56
See application file for complete search history.

(56) References Cited

U.S. PATENT DOCUMENTS 7,781,781 B2 8/2010 Adkisson
2009/0045487 A1 2/2009 Jung
(Continued)

FOREIGN PATENT DOCUMENTS

CN 103000649 A 3/2013
TW 201521172 A 6/2015

*Primary Examiner* — Ismail Muse
(74) *Attorney, Agent, or Firm* — Winston Hsu

(57) ABSTRACT

A wafer level chip scale package (WLCSP) has a device chip, a carrier chip, an offset pad, a conductive spacing bump and a through hole via (THV). The device chip is attached to the carrier chip. The offset pad is disposed on a first surface of the device chip. The conductive spacing bump is formed on the offset pad. The through hole via includes a through hole and a hole metal layer. The through hole penetrates through the carrier chip and the device chip, and the hole metal layer is formed in the through hole and in contact with the offset pad.

19 Claims, 8 Drawing Sheets

(51) Int. Cl.
    *H01L 23/48*     (2006.01)
    *H01L 23/31*     (2006.01)
    *H01L 21/56*     (2006.01)
    *H01L 21/768*     (2006.01)
    *H01L 23/498*     (2006.01)
    *H01L 23/00*     (2006.01)
    *H01L 27/146*     (2006.01)

(52) U.S. Cl.
    CPC .............. *H01L 24/13* (2013.01); *H01L 24/32* (2013.01); *H01L 24/83* (2013.01); *H01L 27/14618* (2013.01); *H01L 27/14627* (2013.01); *H01L 27/14632* (2013.01); *H01L 27/14636* (2013.01); *H01L 2224/0237* (2013.01); *H01L 2224/0401* (2013.01); *H01L 2224/05124* (2013.01); *H01L 2224/05147* (2013.01); *H01L 2224/1134* (2013.01); *H01L 2224/11462* (2013.01); *H01L 2224/13016* (2013.01); *H01L 2224/13027* (2013.01); *H01L 2224/13139* (2013.01); *H01L 2224/13144* (2013.01); *H01L 2224/13147* (2013.01); *H01L 2224/13155* (2013.01); *H01L 2224/32225* (2013.01); *H01L 2224/73253* (2013.01); *H01L 2924/0132* (2013.01); *H01L 2924/15311* (2013.01)

(56) References Cited

U.S. PATENT DOCUMENTS

| | | | |
|---|---|---|---|
| 2012/0009736 A1* | 1/2012 | Yang | H01L 23/3128 438/109 |
| 2013/0181342 A1* | 7/2013 | Park | H01L 23/49816 257/737 |
| 2013/0249104 A1* | 9/2013 | Chi | H01L 21/561 257/774 |
| 2014/0264905 A1* | 9/2014 | Lee | H01L 21/568 257/774 |
| 2014/0342502 A1* | 11/2014 | Ma | H01L 21/76898 438/107 |
| 2015/0137387 A1* | 5/2015 | Choi | H01L 23/481 257/774 |
| 2016/0133601 A1* | 5/2016 | Ko | H01L 21/78 257/738 |
| 2017/0186732 A1* | 6/2017 | Chu | H01L 21/31111 |

* cited by examiner

WAFER LEVEL CHIP SCALE PACKAGE HAVING CONTINUOUS THROUGH HOLE VIA CONFIGURATION AND FABRICATION METHOD THEREOF

CROSS-REFERENCE TO RELATED APPLICATIONS

This application claims the benefit of Taiwan Patent Application No. 105106770, filed 2016 Mar. 4, and included herein by reference.

BACKGROUND OF THE INVENTION

1. Field of the Invention

The present invention relates to packaging semiconductor chips, and more particularly to a wafer level chip scale package (WLCSP) having continuous through hole vias (THVs) and a fabrication method thereof.

2. Description of the Prior Art

A wafer level chip scale package (WLCSP) is different from a conventional semiconductor package. The integrated circuits of the WLCSP are tested and packaged in the wafer stage before dicing the WLCSP. The size of the WLCSP is not greater than 1.44 times of the size of the chips. A WLCSP usually has double-sided longitudinal electrical interconnections for connecting terminals to the bottom of the chip to reduce the size of the substrate or omit the substrate. A conventional double-sided longitudinal electrical interconnection may be a through hole via (THV) or a chip side redistribution layer (RDL).

In the packaging process of a conventional WLCSP using through hole vias (THVs), a plurality of composite stacked chips are packaged in the wafer stage. Each of the composite stacked chips has a device chip and a carrier chip integrated with the device chip. A laser drill or an etching process may be performed to form through holes penetrating through the device chip and the carrier chip. The through holes may be filled with copper (Cu), an alloy of gold (Au), nickel (Ni) and copper (Cu), polysilicon, tungsten (Wu) or other conductive materials to form the double-sided longitudinal electrical interconnections of the composite stacked chip. Since the chips could be electrically connected to the substrate without performing a wire bonding process, the area of the substrate may be used more effectively and the packaging process can be simplified. However, it is difficult to control the depth of the through holes when performing the laser drill or the etching process, causing over-etching or under-etching of the through holes. When the through holes are over-etched, the through holes may penetrate through the solder pads of the device chip, diffusing the etching material or etching plasma to an active area of the device chip, polluting the electronic elements, and resulting in interconnection failure between solder pads and the conductive material filled in the through holes. When the through holes are under-etched, the conductive material filled in the through holes would fail to connect to the solder pads.

SUMMARY OF THE INVENTION

An embodiment of the present invention provides a wafer level chip scale package (WLCSP). The WLCSP comprises a device chip, a carrier chip, a device, a pad structure, an offset pad, a conductive spacing bump, an adhesive spacing layer, a protection shield, a through hole via (THV), a protection layer, and a plurality of terminals. The device chip has a first surface and a second surface. The carrier chip has a third surface and a fourth surface, and the second surface of the device chip is attached to the third surface of the carrier chip. The device is disposed on the first surface of the device chip. The pad structure is embedded in the device chip and comprises a plurality of metal pads. The metal pads are in parallel and electrically connected to each other. The offset pad is disposed on the first surface of the device chip and electrically connected to the metal pads. The conductive spacing bump is formed on the offset pad. The adhesive spacing layer is formed on the first surface of the device chip to encapsulate the conductive spacing bump. The protection shield is adhered to the adhesive spacing layer to protect the device. The through hole via comprises a through hole and a hole metal layer. The through hole penetrates through the carrier chip and the device chip, and the hole metal layer is formed in the through hole and in contact with the offset pad. The protection layer is formed on the fourth surface and covering the through hole. The terminals are formed on the fourth surface and penetrate through the protection layer.

Another embodiment of the present invention provides a method of forming a wafer level chip scale package (WLCSP). The method comprises providing a device chip and a carrier chip, the device chip having a first surface and a second surface, a pad structure having a plurality of metal pads being embedded in the device chip, the metal pads being in parallel and electrically connected to each other, the carrier chip having a third surface and a fourth surface; attaching the second surface of the device chip to the third surface of the carrier chip; forming at least an offset pad on the first surface of the device chip; disposing a device on the first surface of the device chip; forming a conductive spacing bump on the offset pad; forming an adhesive spacing layer on the first surface of the device chip to encapsulate the conductive spacing bump; adhering a protection shield to the adhesive spacing layer to protect the device; forming a through hole via (THV) having a through hole and a hole metal layer, the through hole penetrating through the carrier chip and the device chip, the hole metal layer being formed in the through hole and in contact with the offset pad; forming a protection layer on the fourth surface to cover the through hole; and forming a plurality of terminals on the fourth surface. The terminals penetrate through the protection layer, and the offset pad is electrically connected to the metal pads.

These and other objectives of the present invention will no doubt become obvious to those of ordinary skill in the art after reading the following detailed description of the preferred embodiment that is illustrated in the various figures and drawings.

DETAILED DESCRIPTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
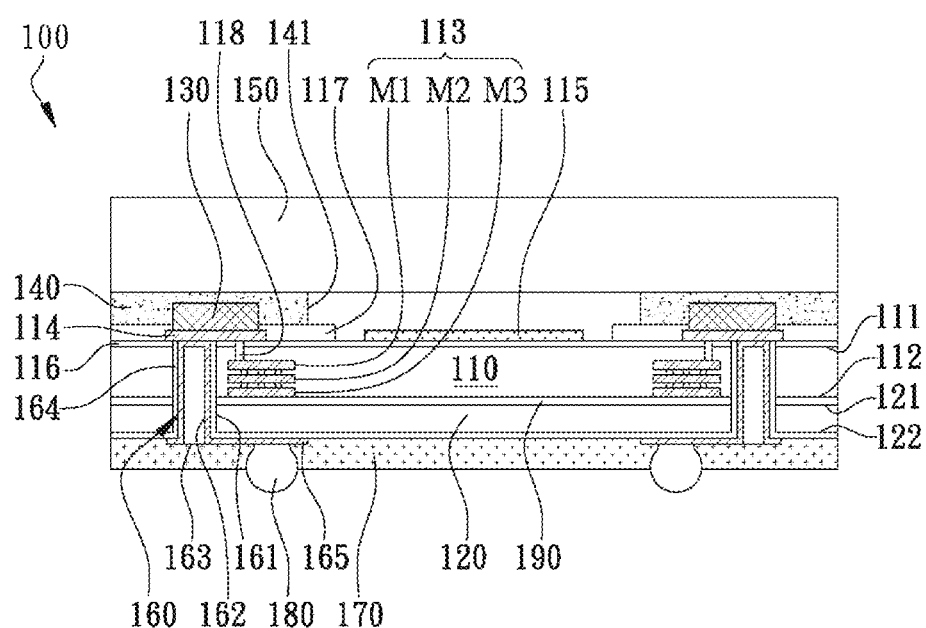
FIG. 1 is a cross-sectional diagram of a wafer level chip scale package (WLCSP) having continuous through hole via (THV) configuration according to a first embodiment of the present invention.

According to a first embodiment of the present invention, a wafer level chip scale package (WLCSP) 100 having continuous through hole via (THV) configuration is illustrated in FIG. 1 for a cross-sectional view. The WLCSP 100 has a device chip 110, a carrier chip 120, at least a conductive spacing bump 130, an adhesive spacing layer 140, a protection shield 150, at least a through hole via 160, a protection layer 170, and a plurality of terminals 180.

The device chip 110 has a first surface 111 and a second surface 112. The body of the device chip 110 may be a semiconductor layer, e.g. a monocrystalline silicon layer. An insulation layer 116 is formed on the first surface 111 of the device chip 110. A pad structure 113 is embedded in the device chip 110, and at least an offset pad 114 is disposed on the first surface 111 and electrically connected to the pad structure 113. The pad structure 113 comprises a plurality of metal pads M1, M2 and M3. The metal pads M1, M2 and M3 are in parallel and electrically connected to each other. In an embodiment of the present invention, the metal pads M1, M2 and M3 may be electrically connected to each other through conductive pillars. The centers of the metal pads M1, M2 and M3 may be aligned with each other. The offset pad 114 may be made of aluminum (Al) or aluminum-copper (AlCu) alloy. Moreover, a device 115 is formed on the first surface 111. The device 115 may be an image sensor with a microlens structure. The image sensor may be a CMOS image sensor. In other embodiments of the present invention, the device 115 may be an integrated circuit, a sensor of a microphone chip, or a micro-electro-mechanical-systems (MEMS) device. A surface dielectric layer 117 may be formed on the insulation layer 116. The insulation layer 116 may be used as an insulator for the periphery of the bottom surface of the offset pad 114. The surface dielectric layer 117 may be used as an insulator for the periphery of the top of the offset pad 114.

The carrier chip 120 has a third surface 121 and a fourth surface 122. The second surface 112 of the device chip 110 is attached to the third surface 121 of the carrier chip 120. An adhesive layer 190 may be formed between the third surface 121 of the carrier chip 120 and the second surface 112 of the device chip 110. Since there is no coefficient of thermal expansion (CTE) mismatch between the device chip 110 and the carrier chip 120, warpage of the device chip 110 and the carrier chip 120 may be avoided in a subsequent thermal treatment process. Thus, the durability of the device chip 110 and the carrier chip 120 may be enhanced.

The conductive spacing bump 130 is formed on the offset pad 114. In the embodiment, the conductive spacing bump 130 may comprise an electroplated metal block. The conductive spacing bump 130 may be of gold (Au), sliver (Ag), copper (Cu), an alloy of gold (Au), sliver (Ag) and copper (Cu), or a combination of copper, nickel and gold (Cu/Ni/Au). In an embodiment of the present invention, a conductive pillar 118 may be used to electrically connect the offset pad 114 and the pad structure 113. The conductive pillar 118 may be formed below the conductive spacing bump 130 to obtain better support and protection.

An adhesive spacing layer 140 is formed on the first surface 111 of the device chip 110 and configured to encapsulate the conductive spacing bump 130. The conductive spacing bump 130 may be isolated from the ambient air to avoid being shorted or experiencing interference. The conductive spacing bump 130 is electrically connected to the through hole via 160 and used to enhance the structural strength of the through hole via 160. The adhesive spacing layer 140 may have an opening 141, and the device 115 is disposed within the opening 141 and not covered by the adhesive spacing layer 140. The protection shield 150 is adhered to the adhesive spacing layer 140 to protect the device 115.

The through hole via 160 comprises a through hole 161 and a hole metal layer 162. The through hole 161 is off-center aligned with the offset pad 114 and the conductive spacing bump 130 and penetrates through the carrier chip 120, the device chip 110 and the adhesive layer 190. The hole metal layer 162 is formed in the through hole 161 and electrically connected to the offset pad 114. The depth of the through hole 161 is between 10 micrometer and 75 micrometer. In an embodiment of the present invention, the through hole 161 penetrates through the insulation layer 116 to expose the offset pad 114. A dielectric inner lining 164 may be formed on the wall of the through hole 161 to isolate the hole metal layer 162 so as to avoid a current leaking from the hole metal layer 162 to the carrier chip 120.

The protection layer 170 is formed on the fourth surface 122 to cover the through hole 161. In an embodiment of the present invention, the protection layer 170 may seal an opening 163 of the through hole via 160 without filling the through hole 161 to isolate the through hole 161 from ambient air.

The terminals 180 are formed on the fourth surface 122 of the carrier chip 120 and penetrate through the protection layer 170. In an embodiment of the present invention, the hole metal layer 162 may be integrated with a redistribution circuit 165 formed on the fourth surface 122. A terminal 180 of the plurality of terminals 180 may be electrically connected to the redistribution circuit 165. The terminals 180 may comprise a plurality of solder balls.

A method of forming the WLCSP 100 is described as follows, and FIGS. 2A to 2J illustrate cross-sectional views corresponding to the steps of the method.

Figure 2A:
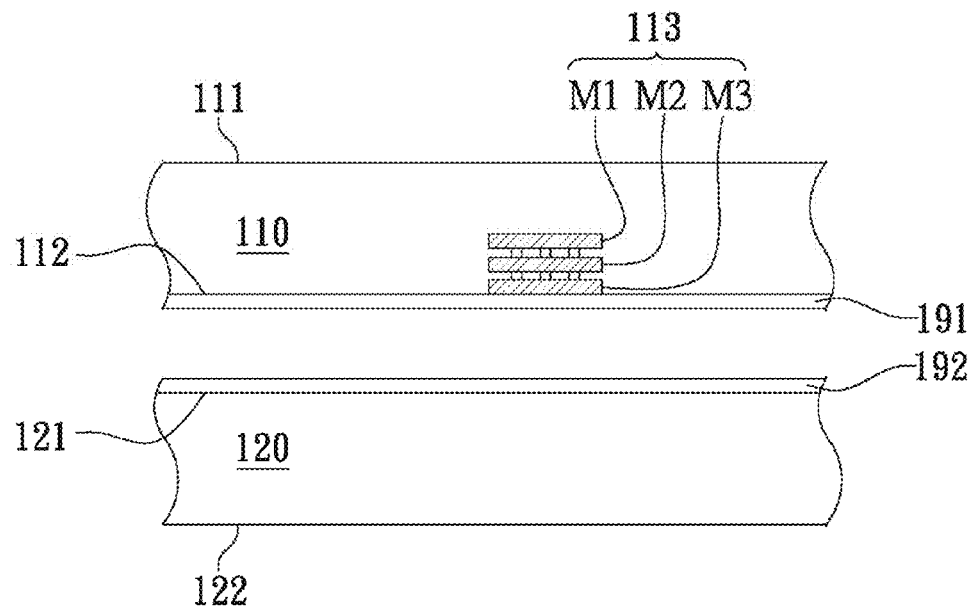
FIGS. 2A to 2J are component cross-sectional views showing each primary processing step of the method according to the first embodiment of the present invention.

As shown in FIG. 2A, the device chip 110 and the carrier chip 120 are provided in the wafer stage. The device chip 110 has the first surface 111 and the second surface 112. The carrier chip 120 has the third surface 121 and the fourth surface 122. The pad structure 113 is embedded in the device chip 110. The pad structure 113 comprises the plurality of metal pads M1, M2 and M3. The metal pads M1, M2 and M3 are in parallel and electrically connected to each other via conductive pillars. The metal pad M3 may be attached to the second surface 112.

Figure 2B:
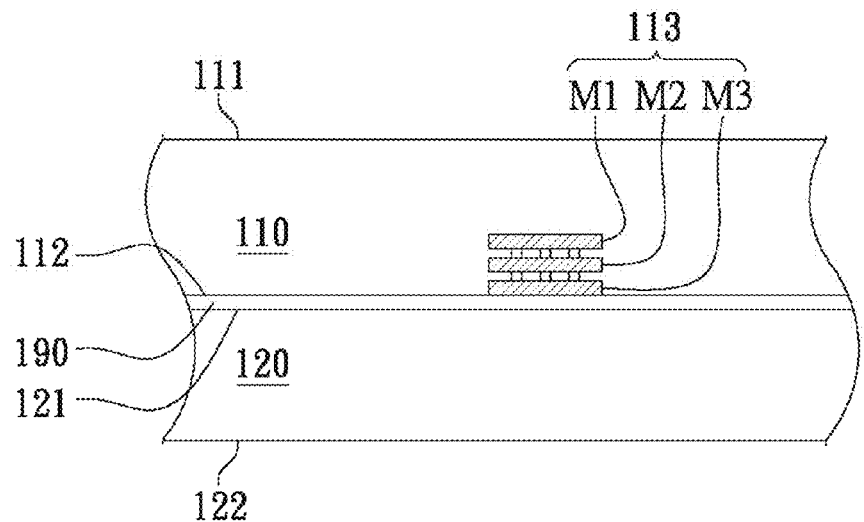

As shown in FIGS. 2A and 2B, the second surface 112 of the device chip 110 may be attached to the third surface 121 of the carrier chip 120 through fusion bonding. A material 191 on the second surface 112 may be fusion bonded to a material 192 on the third surface 121. The fusion bonding comprises a heating process for melting the material 191 and the material 192 to form the adhesive layer 190. The adhesive layer 190 may be an oxide layer.

Figure 2C:
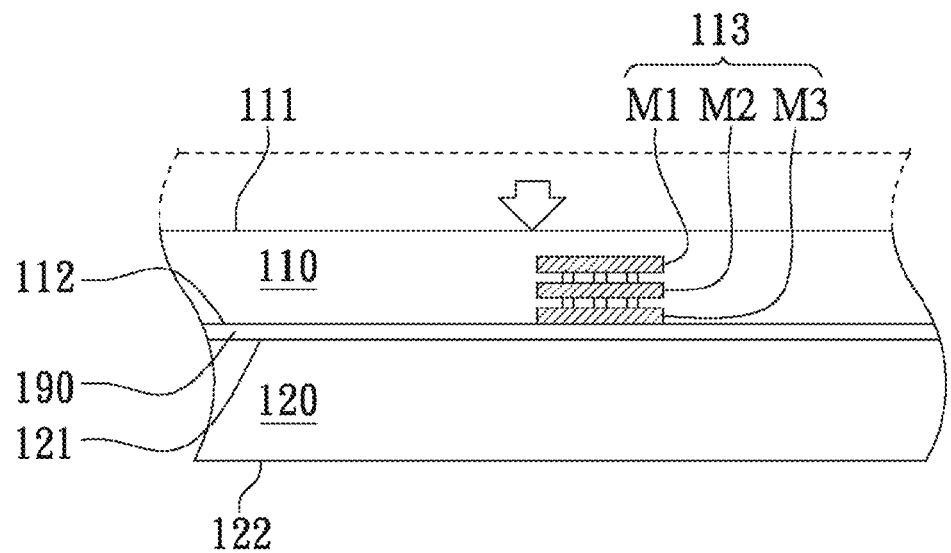
Figure 2D:
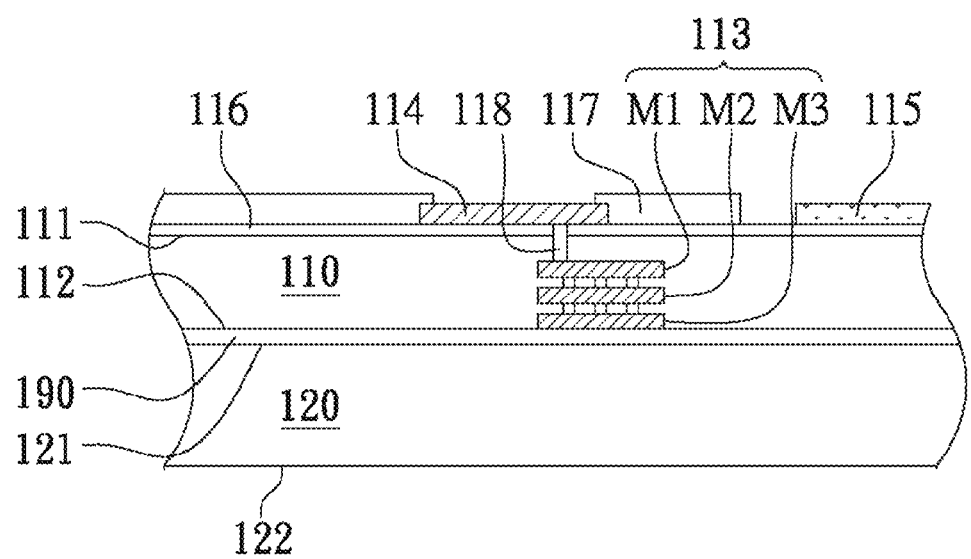

As shown in FIG. 2C, a first wafer thinning process is performed to thin the device chip 110 after the device chip 110 is attached to the carrier chip 120 and before the offset pad 114 is formed on the first surface 111 of the device chip 110 (as shown in FIG. 2D).

As shown in FIG. 2D, an insulation layer 116 is formed on the first surface 111. The conductive pillar 118 penetrates through the insulation layer 116 and is in contact with the pad structure 113. Then, at least an offset pad 114 is formed on the insulation layer 116. The device 115 is disposed on the insulation layer 116, and the surface dielectric layer 117 is formed on the insulation layer 116. The offset pad 114 is electrically connected to the conductive pillar 118 and to the metal pad M1 of the pad structure 113 via the conductive pillar 118.

Figure 2E:
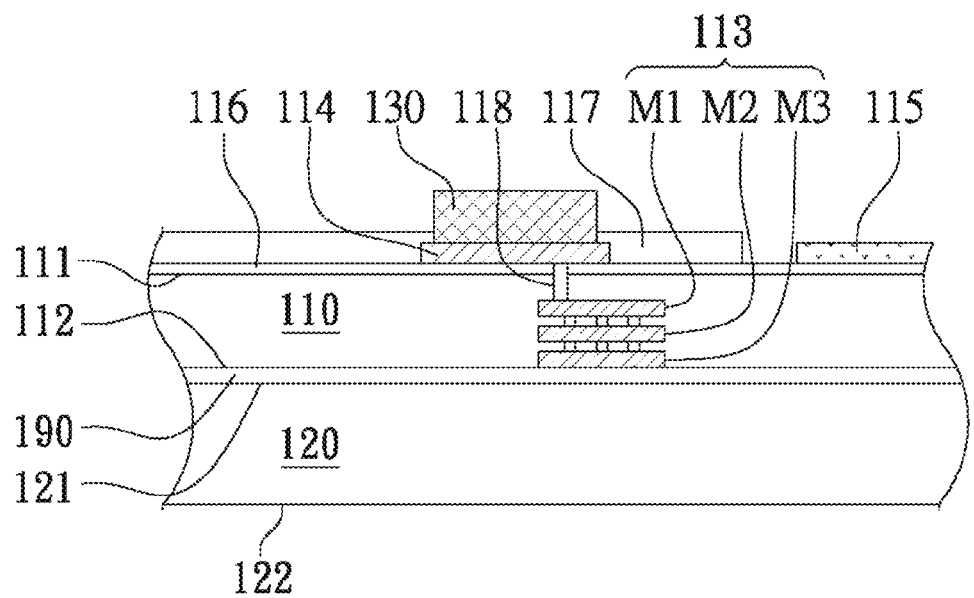

As shown in FIG. 2E, at least a conductive spacing bump 130 is formed on the offset pad 114. In an embodiment of the present invention, the conductive pillar 118 may be formed below the conductive spacing bump 130. The conductive spacing bump 130 may protrude over the surface dielectric layer 117. The conductive spacing bump 130 may be formed by performing an electroplating process.

Figure 2F:
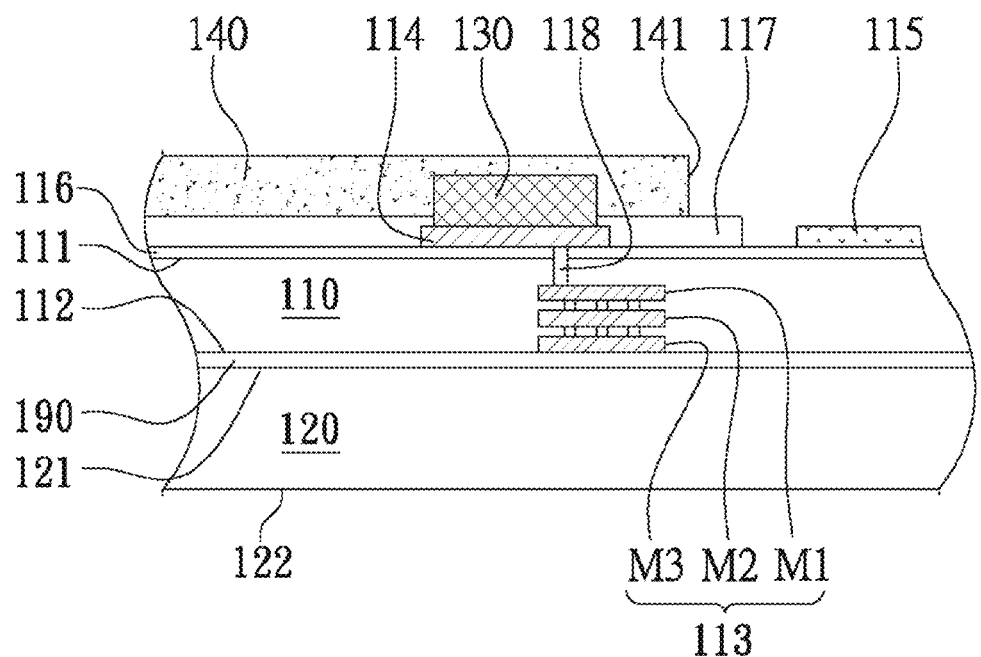

Subsequently, as shown in FIG. 2F, the adhesive spacing layer 140 is formed on the first surface 111 of the device chip 110. The adhesive spacing layer 140 encapsulates the conductive spacing bump 130 and partially covers the surface dielectric layer 117. The conductive spacing bump 130 may be isolated from ambient air to avoid being shorted or experiencing interference. In an embodiment of the present invention, the adhesive spacing layer 140 may have an opening 141, and the device 115 is disposed within the opening 141 and not covered by the adhesive spacing layer 140. The adhesive spacing layer 140 may be of a die attach material (DAM).

Figure 2G:
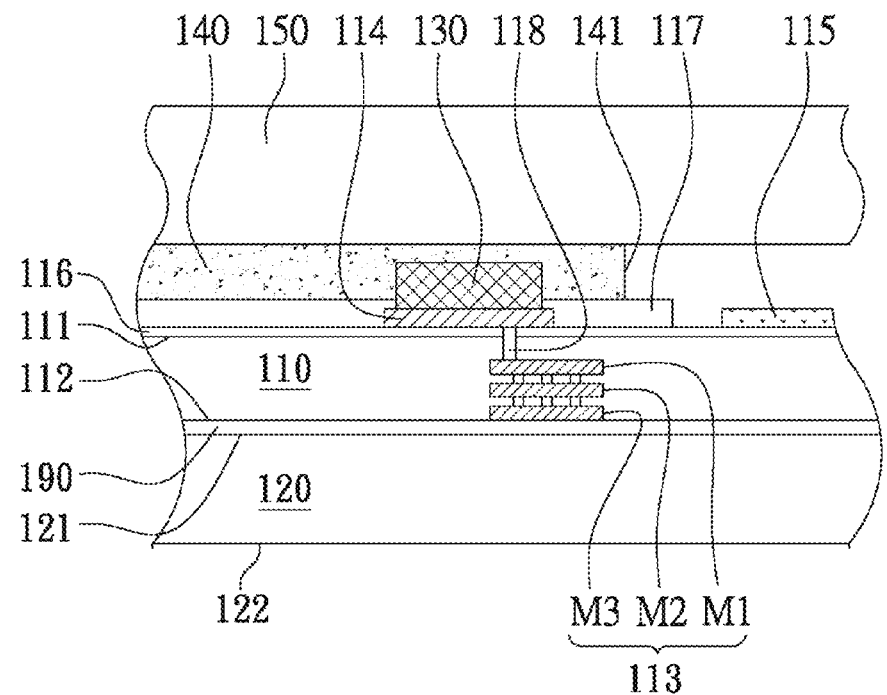

As shown in FIG. 2G, the protection shield 150 is adhered to the adhesive spacing layer 140 to protect the device 115. The protection shield 150 may be transparent, e.g. an optical glass, for passing light.

Figure 2H:
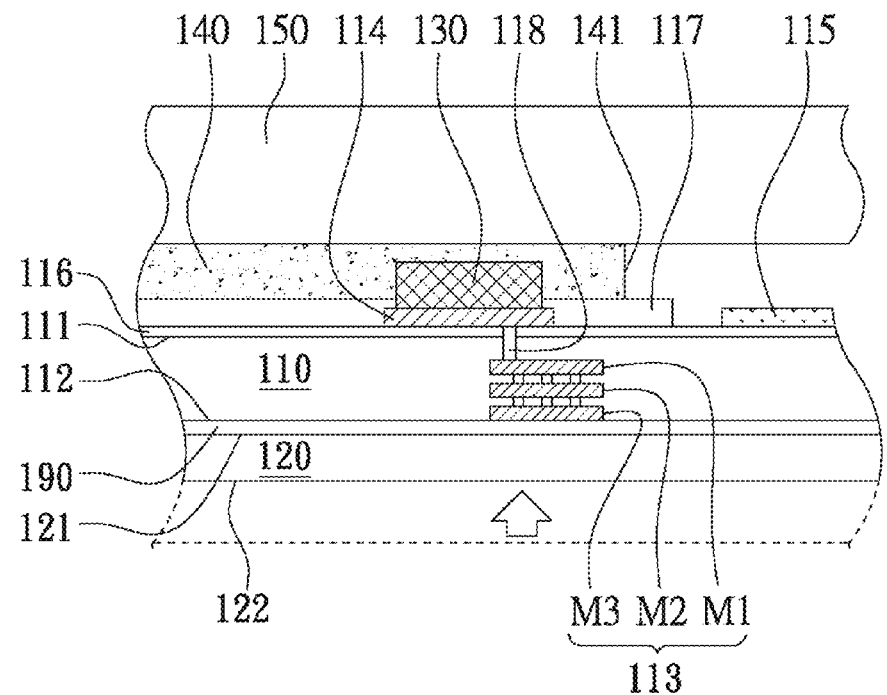

As shown in FIG. 2H, a second wafer thinning process is performed to thin the carrier chip 120 after the protection shield 150 is adhered to the adhesive spacing layer 140 and before the through hole via 160 is formed.

Figure 2I:
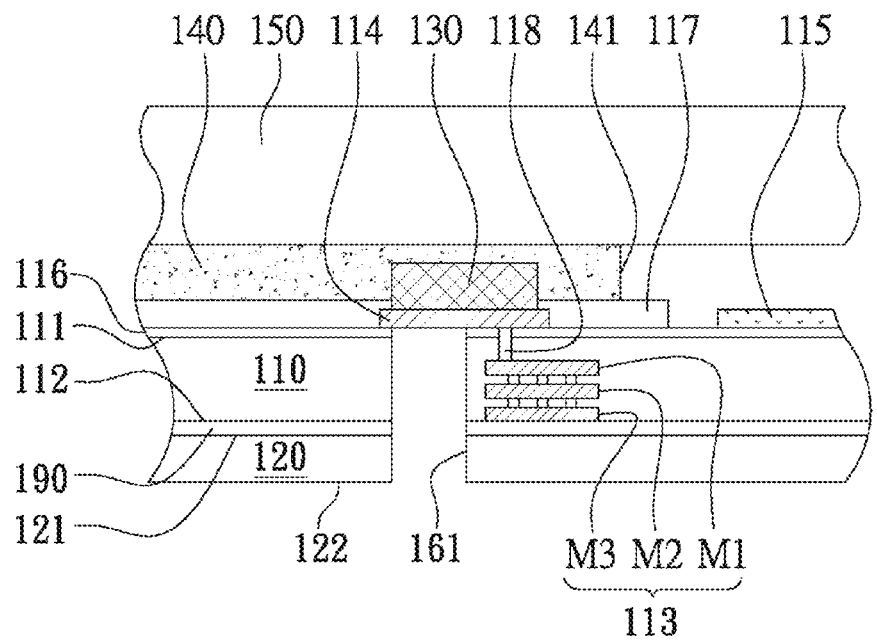

As shown in FIG. 2I, at least a through hole 161 of the through hole via 160 is formed. The through hole 161 of the through hole via 160 may be formed by performing a laser drill or an etching process. Since the conductive spacing bump 130 is in contact with the offset pad 114, process contamination and interconnection failure of via would be avoided if the offset pad 114 is over etched.

Figure 2J:
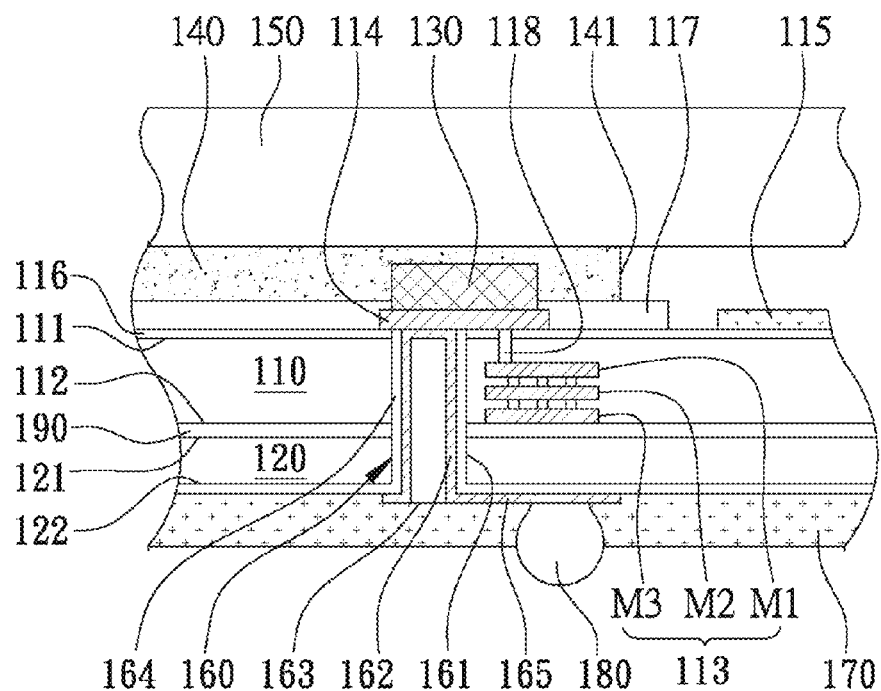

As shown in FIG. 2J, the hole metal layer 162 is deposited in the through hole 161. The hole metal layer 162 may be formed in the through hole 161 by electroplating, vacuum sputtering, chemical vapor deposition, physical vapor deposition, etc. The dielectric inner lining 164 may be formed in the through hole 161 before the hole metal layer 162 is formed so as to avoid a current leaking from the hole metal layer 162 to the carrier chip 120. The through hole 161 may be off-center aligned with the offset pad 114 and the conductive spacing bump 130 and penetrates through the carrier chip 120 and the device chip 110. The hole metal layer 162 is formed in the through hole 161 and is in contact with the offset pad 114. The hole metal layer 162 may be of gold (Au), nickel (Ni), copper (Cu), or an alloy containing at least one of gold (Au), nickel (Ni) and copper (Cu). In another embodiment of the present invention, the hole metal layer 162 may be integrated with the redistribution circuit 165 formed on the fourth surface 122.

As shown in FIG. 2J, the protection layer 170 may be formed on the fourth surface 122 to cover the through hole 161, such that the hole metal layer 162 and the redistribution circuit 165 may be isolated from the ambient air to avoid being shorted or experiencing interference. In an embodiment of the present invention, the protection layer 170 may seal an opening 163 of the through hole via 160 without filling the through hole 161.

As shown in FIG. 2J, the plurality of terminals 180 are formed on the carrier chip 120 and penetrate through the protection layer 170. In an embodiment of the present invention, the terminals 180 are formed on the protection layer 170.

Figure 3:
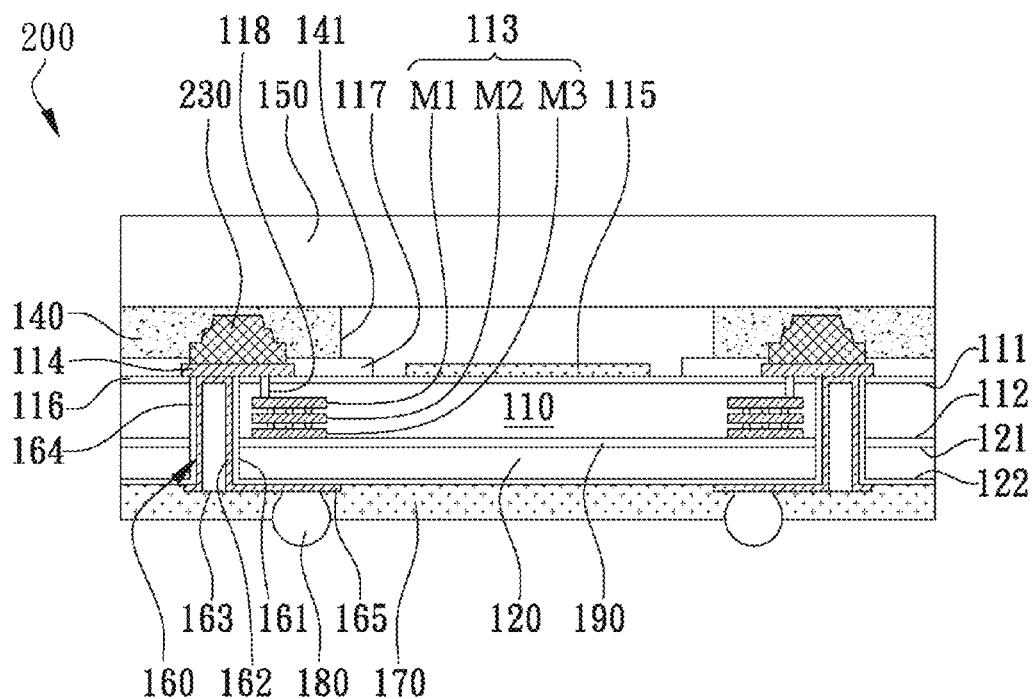
FIG. 3 is a cross-sectional diagram of a wafer level chip scale package (WLCSP) having continuous through hole via (THV) configuration according to a second embodiment of the present invention.

According to a second embodiment of the present invention, another wafer level chip scale package (WLCSP) 200 having continuous through hole via (THV) configuration is illustrated in FIG. 3 for a cross-sectional view. The same reference numbers used in the first embodiment and the second embodiment represent the same elements, and thus descriptions of the same elements will not be repeated hereinafter. The WLCSP 200 comprises the device chip 110, the carrier chip 120, at least a conductive spacing bump 230, the adhesive spacing layer 140, the protection shield 150, at least a through hole via 160, the protection layer 170, and the plurality of terminals 180.

As shown in FIG. 3, the device chip 110 has the first surface 111 and the second surface 112. The pad structure 113 is embedded in the device chip 110. At least an offset pad 114 is disposed on the first surface 111 and electrically connected to the pad structure 113. The offset pad 114 may be of copper (Cu), aluminum (Al) or aluminum-copper (AlCu) alloy. The device 115 is formed on the first surface 111.

The carrier chip 120 has the third surface 121 and the fourth surface 122. The second surface 112 of the device chip 110 is attached to the third surface 121 of the carrier chip 120.

In the embodiment, the conductive spacing bump 230 is formed on the offset pad 114 and protrudes over the first surface 111. The conductive spacing bump 230 may comprise a stud bump formed in a wire bonding process to provide rigid support as so to avoid fracture and damage resulted from mismatched thermal stresses in a subsequent thermal treatment process of the WLCSP 200. The conductive spacing bump 230 may be of gold (Au), sliver (Ag), copper (Cu), or an alloy of gold (Au), sliver (Ag) and copper (Cu).

In the embodiment, the adhesive spacing layer 140 is formed on the first surface 111 of the device chip 110 to encapsulate the conductive spacing bump 230. The protection shield 150 is adhered to the adhesive spacing layer 140 to protect the device 115.

In the embodiment, the through hole 161 is off-center aligned with the offset pad 114 and penetrates through the carrier chip 120 and the device chip 110. The hole metal layer 162 is formed in the through hole 161 and electrically connected to the offset pad 114. The through hole 161 is off-center aligned with the conductive spacing bump 230. In addition, the through hole 161 also penetrates through the adhesive layer 190. In an embodiment of the present invention, the through hole 161 penetrates through the insulation layer 116 to expose the offset pad 114. The dielectric inner lining 164 may be formed on the wall of the through hole 161 to isolate the hole metal layer 162 so as to avoid a current leaking from the hole metal layer 162 to the device chip 110 and the carrier chip 120.

In the embodiment, the protection layer 170 is formed on the fourth surface 122 to cover the through hole 161. In an embodiment of the present invention, the protection layer 170 may seal the opening 163 of the through hole via 160 without filling the through hole 161 to isolate the through hole 161 from the ambient air.

In the embodiment, the terminals 180 are formed on the fourth surface 122 of the carrier chip 120 and penetrate through the protection layer 170. In an embodiment of the present invention, the hole metal layer 162 may be integrated with the redistribution circuit 165 formed on the fourth surface 122, and one of the terminals 180 may be in contact with the redistribution circuit 165. The terminals 180 may comprise a plurality of solder balls.

Figure 4A:
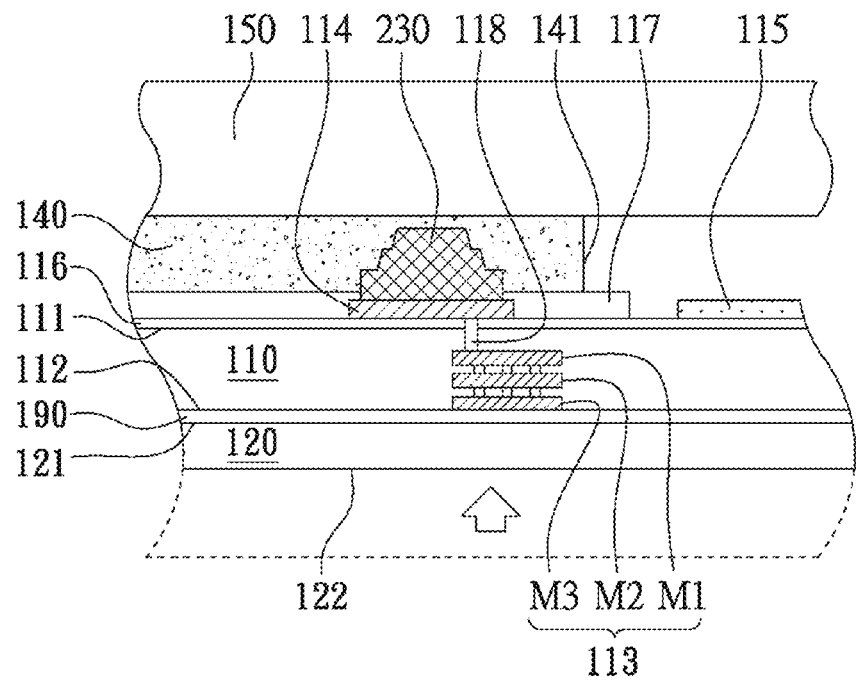
FIGS. 4A to 4B are cross-sectional diagrams illustrating the WLCSP before and after forming the through hole according to the second embodiment of the present invention.
Figure 4B:
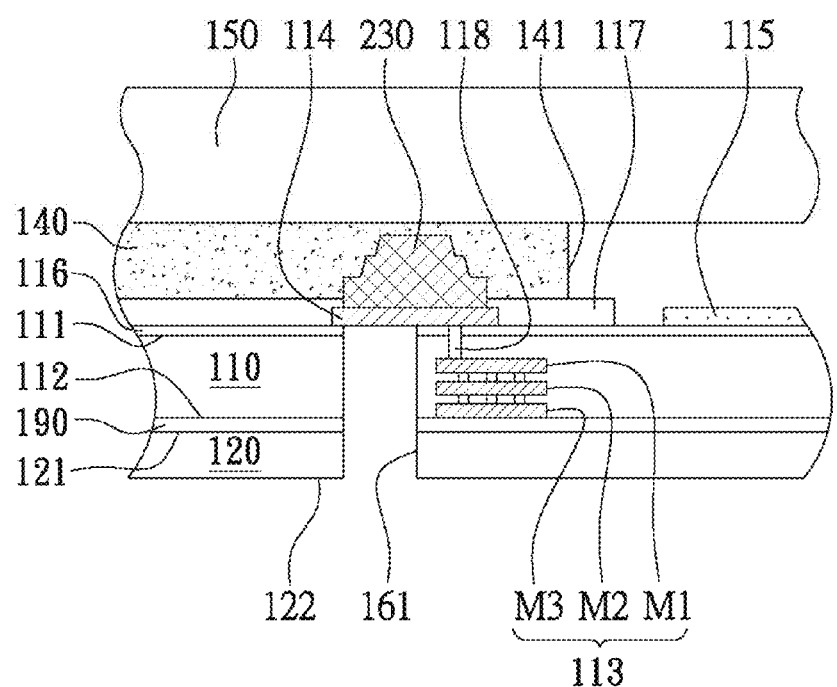

The process steps of forming the WLCSP 200 according to the second embodiment are roughly the same as the process steps of forming the WLCSP 100 according to the first embodiment. FIGS. 4A to 4B are cross-sectional diagrams illustrating the WLCSP 200 before and after forming the through hole. The process steps before forming the through hole of the WLCSP 200 are the same as the process steps of the first embodiment shown in FIGS. 2A to 2G.

As shown in FIG. 4A, the second wafer thinning process is performed to thin the carrier chip 120 before the through hole of the through hole via is formed.

As shown in FIG. 4B, a through hole 161 of at least a through hole via is formed. The through hole 161 is off-center aligned with the offset pad 114 and penetrates through the carrier chip 120 and the device chip 110. In an embodiment of the present invention, the through hole 161 may be off-center aligned with the conductive spacing bump 230. Since the conductive spacing bump 230 is in contact with the offset pad 114, process pollution and interconnection failure of via would be avoided if the offset pad 114 is over etched.

According to the embodiments of the present invention, the present invention may achieve the following effects:

1. The wafer level chip scale package (WLCSP) of the present invention may replace a conventional wire bonding package so as to reduce the chip size, simply the packaging process, and reduce the packaging cost.

2. Process pollution and interconnection failure of via may be avoided if over-etching of the through hole occurs when forming the through hole via of the WLCSP according to the present invention.

3. The conductive spacing bump of the WLCSP according to the present invention may provide rigid support to the through hole via as so to avoid fracture and damage of the metal pads and the offset pad in subsequent processes of the WLCSP.

In summary, the embodiments of the present invention provide a wafer level chip scale package (WLCSP) and a fabrication method thereof. The conventional wire bonding package may be replaced by the WLCSP of the present invention. The chip size and the packaging cost may be reduced, and the packaging process may be simplified. A composite chip package may have continuous through hole vias (THVs). Moreover, process pollution and interconnection failure of via may be avoided while over-etching of the through hole occurs. Accordingly, the yield of the WLCSP would be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer level chip scale package (WLCSP) comprising:
a device chip having a first surface and a second surface;
a carrier chip having a third surface and a fourth surface, wherein the second surface of the device chip is attached to the third surface of the carrier chip;
a device disposed on the first surface of the device chip;
a pad structure embedded in the device chip and comprising a plurality of metal pads, wherein the metal pads are in parallel and electrically connected to each other;
an offset pad disposed on the first surface of the device chip and electrically connected to the metal pads;
a conductive spacing bump formed on and in direct contact with the offset pad;
an adhesive spacing layer formed on the first surface of the device chip to encapsulate the conductive spacing bump;
a protection shield adhered to the adhesive spacing layer to protect the device;
a through hole via comprising a through hole and a hole metal layer, the through hole penetrating through the carrier chip and the device chip, and the hole metal layer being formed in the through hole and in contact with the offset pad;
a protection layer formed on the fourth surface and covering the through hole; and
a plurality of terminals formed on the fourth surface and penetrating through the protection layer.

2. The wafer level chip scale package of claim 1, wherein the protection layer seals an opening of the through hole via without filling the through hole to isolate the through hole from the ambient air.

3. The wafer level chip scale package of claim 1, wherein an adhesive layer is formed between the third surface of the carrier chip and the second surface of the device chip, and the through hole penetrates through the adhesive layer.

4. The wafer level chip scale package of claim 1, wherein an insulation layer is formed on the first surface of the device chip, and the through hole penetrates through the insulation layer to expose the offset pad.

5. The wafer level chip scale package of claim 1, wherein the conductive spacing bump comprises an electroplated metal block.

6. The wafer level chip scale package of claim 1, wherein the conductive spacing bump comprises a stud bump providing support to the conductive spacing bump.

7. The wafer level chip scale package of claim 1, wherein the hole metal layer is integrated with a redistribution circuit formed on the fourth surface, and a terminal of the plurality of terminals is in contact with the redistribution circuit.

8. The wafer level chip scale package of claim 1, wherein the plurality of terminals comprise a plurality of solder balls.

9. The wafer level chip scale package of claim 1, wherein a conductive pillar is connected between the offset pad and the pad structure, and the conductive pillar is completely formed below the conductive spacing bump.

10. The wafer level chip scale package of claim 1, wherein the device is an electronic device.

11. The wafer level chip scale package of claim 1, wherein the protection shield is a transparent protection shield.

12. The wafer level chip scale package of claim 1, wherein the through hole is off-center aligned with the offset pad.

13. A method of forming a wafer level chip scale package (WLCSP), the method comprising:
    providing a device chip and a carrier chip, the device chip having a first surface and a second surface, a pad structure having a plurality of metal pads being embedded in the device chip, the metal pads being in parallel and electrically connected to each other, the carrier chip having a third surface and a fourth surface;
    attaching the second surface of the device chip to the third surface of the carrier chip;
    thinning the device chip after the device chip is attached to the carrier chip and before forming at least an offset pad on the first surface of the device chip, wherein the offset pad is electrically connected to the metal pads;
    disposing a device on the first surface of the device chip;
    forming a conductive spacing bump on the offset pad;
    forming an adhesive spacing layer on the first surface of the device chip to encapsulate the conductive spacing bump;
    adhering a protection shield to the adhesive spacing layer to protect the device;
    thinning the carrier chip after the protection shield is adhered to the adhesive spacing layer and before forming a through hole via, wherein the through hole via comprises a through hole and a hole metal layer, the through hole penetrates through the carrier chip and the device chip, and the hole metal layer is formed in the through hole and in contact with the offset pad;
    forming a protection layer on the fourth surface to cover the through hole; and
    forming a plurality of terminals on the fourth surface, wherein the terminals penetrate through the protection layer.

14. The method of claim 13, wherein the protection layer seals an opening of the through hole via without filling the through hole to isolate the through hole from the ambient air.

15. The method of claim 13, wherein the second surface of the device chip is attached to the third surface of the carrier chip through fusion bonding.

16. The method of claim 13 further comprising forming an insulation layer on the first surface of the device chip, wherein the through hole penetrates through the insulation layer to expose the offset pad.

17. The method of claim 13, wherein the hole metal layer is integrated with a redistribution circuit formed on the fourth surface, and a terminal of the plurality of terminals is in contact with the redistribution circuit.

18. The method of claim 13, wherein a conductive pillar is connected between the offset pad and the pad structure, and the conductive pillar is completely formed below the conductive spacing bump.

19. The method of claim 13, wherein the through hole is off-center aligned with the offset pad.

* * * * *